US009287870B2

(12) United States Patent
Richardson et al.

(10) Patent No.: US 9,287,870 B2
(45) Date of Patent: Mar. 15, 2016

(54) HIGH SPEED, HIGH EFFICIENCY, HIGH POWER RF PULSE MODULATING INTEGRATED SWITCH (71) Applicant: Raytheon Company, Waltham, MA (US)

(72) Inventors: Mark T. Richardson, Torrance, CA (US); Denpol Kultran, Hawthorne, CA (US); George W. Gerace, Marina Del Rey, CA (US); Richard D. Young, Lawndale, CA (US); Mark E. Stading, Hermosa Beach, CA (US); Jeffrey H. Saunders, Andover, MA (US)

(73) Assignee: Raytheon Company, Waltham, MA (US)

( * ) Notice: Subject to any disclaimer, the term of this patent is extended or adjusted under 35 U.S.C. 154(b) by 305 days.

(21) Appl. No.: 14/075,407

(22) Filed: Nov. 8, 2013

(65) Prior Publication Data
US 2015/0130657 A1 May 14, 2015

(51) Int. Cl.
| | |
|---|---|
| H03K 19/017 | (2006.01) |
| G01S 13/02 | (2006.01) |
| H03K 19/00 | (2006.01) |
| G01S 7/282 | (2006.01) |
| G01S 7/02 | (2006.01) |
| G01S 7/28 | (2006.01) |

(52) U.S. Cl.
CPC ............ *H03K 19/01721* (2013.01); *G01S 7/02* (2013.01); *G01S 7/282* (2013.01); *G01S 13/02* (2013.01); *H03K 19/0013* (2013.01)

(58) Field of Classification Search
CPC ................... H03K 19/01721; H03K 19/0013; G01S 13/02; G01S 7/282; G01S 7/02
USPC .............. 342/175, 82–88, 200–204; 327/172, 327/365
See application file for complete search history.

(56) References Cited

U.S. PATENT DOCUMENTS

| | | | |
|---|---|---|---|
| 3,700,928 A | | 10/1972 | Milberger et al. |
| 5,204,551 A | * | 4/1993 | Bjornholt ............. H03K 17/691 327/172 |
| 7,183,856 B2 | | 2/2007 | Miki et al. |
| 7,701,308 B1 | | 4/2010 | Rodriguez et al. |
| 7,843,182 B2 | | 11/2010 | Ii |
| 2004/0124817 A1 | * | 7/2004 | Katayama ........... H02M 3/1584 323/282 |
| 2013/0088378 A1 | | 4/2013 | Kobayashi |

(Continued)

OTHER PUBLICATIONS

"International Application Serial No. PCT/US2014/054474, International Search Report mailed Nov. 24, 2014", 4 pgs.

(Continued)

*Primary Examiner* — John B Sotomayor
(74) *Attorney, Agent, or Firm* — Schwegman Lundberg & Woessner, P.A.

(57) ABSTRACT

Embodiments of a drain modulator that uses high power switch sensing to control active pulldown are generally described herein. In some embodiments, a logic and sense module is arranged to receive a control signal for controlling an on and an off state of an input of a switch to turn a high power voltage at an output of the switch on and off. A pullup module and a pulldown module are coupled to the input of the switch. An active pulldown module coupled to the output of the switch. The logic and sense module monitors the input to the switch and activates the active pulldown module to drain the output of the switch to a zero voltage when the input of the switch transitions to the off state.

25 Claims, 7 Drawing Sheets

(56) References Cited

U.S. PATENT DOCUMENTS

| | | | |
|---|---|---|---|
| 2015/0130657 A1* | 5/2015 | Richardson | H03K 19/01721 342/175 |
| 2015/0180463 A1* | 6/2015 | Peltonen | H03K 17/0828 327/109 |
| 2015/0270806 A1* | 9/2015 | Wagh | H03F 1/0205 330/296 |

OTHER PUBLICATIONS

"International Application Serial No. PCT/US2014/054474, Written Opinion mailed Nov. 24, 2014", 6 pgs.

Christopher, Rodenbeck T, et al., "Design of Robust On-Chip Drain Modulators for Monolithic Pulsed Power Amplifiers", *IEEE Microwave and Wireless Components Letters*, vol. 23, (May 2013), 267-269.

\* cited by examiner

HIGH SPEED, HIGH EFFICIENCY, HIGH POWER RF PULSE MODULATING INTEGRATED SWITCH

BACKGROUND

Modern radar systems, e.g., active electronically scanned array (AESA) radar systems, have aggressive speed and power requirements for switching on and off the distributed RF amplifier power to the radio frequency (RF) transmit and receive amplifiers. The faster the power switches and settles, the greater the resulting RF signal energy transmitted and received by the antenna and the faster the echo sensitivity. The more efficiently the power is switched on and off, the smaller and/or lighter the power system may be.

High power amplifiers (HPA) are controlled by HPA switches that operate at high voltages, e.g., greater than 24V. Operation at such high voltages involves the use of slower devices to switch on and off the distributed RF amplifier power. For example, a large, slow pass transistor may be used to switch distributed RF amplifier power. An active pull-down circuit is used to increase the speed of the high-to-low transitions for an HPA. Design challenges include the timing of the active pull-down circuit too fast or too slow may lead shorts at the supply voltage, e.g., often designated $V_{dd}$, or decreases switching speed and may damage the antenna.

Power switches have been used in the past for switching on and off distributed RF amplifier power to RF amplifiers and in power converters. However, these designs use several discrete components are thus larger, provide slower switching, use more power to operate, and/or have a limited operating voltage range. Active Phased Arrays use individual solid-state transmit/receive (T/R) microwave module elements at each of its radiating elements (antennas), thus avoiding the distribution and phase shifter losses encountered in the passive array design. The functions of a T/R module may include the generation of the transmit power, the low noise amplification of the received signals coupled to and received from the respective radiating element, the phase shift in the transmit and receive mode for beam steering, and the variable gain setting for aperture weighting during reception. T/R modules are switched from transmit to receive quickly. Thus, the transmit gain path may be turned off during receive, and the receive amplifier path may be biased off during transmit.

Power amplifiers may be turned on by activating a discrete drain modulator that controls the voltage and the direct current (DC) power at the drain of power field effect transistor (FET) switches. To provide highly efficient switching while minimizing wasted power, discrete drain modulators may utilize FET switches with low $R_{ds(On)}$. $R_{ds(On)}$ is the drain-source resistance at a specified drain current and gate-source voltage. Active pull-down circuits are used to quickly discharge output loads. The active pull-down circuit may be a FET or bipolar junction transistor (BJT) with a control signal delayed from the main switch FET control signal.

These approaches are board layout and temperature dependent that result in long control delay calibration, wherein uncertainty in the delay leads to a slow design. Driving a large power FET with fast transitions times consumes significant power to charge/discharge the gate and involves adding components to minimize power, which uses additional board area. Consumer devices, such as cell phone, do not have timelines as challenging as radar. Thus, consumer devices may use a linear regulator pass FET. The response time is slower than a dedicated drain modulator solution because a regulator needs to limit bandwidth for stability.

Discrete drain modulator designs have difficulty timing the active pull down circuit. Moreover, to provide adjustable control signal delay involves performing a component swap for each board design. High power FETs used for low $R_{ds(On)}$ are discrete parts with separate drive circuit. The switch drive uses high current for fast switching, but uses more power when idle. Commercial integrated circuit solutions are regulator based and therefore slow or have a high $R_{ds(On)}$.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass available equivalents of those claims.

Figure 1A:
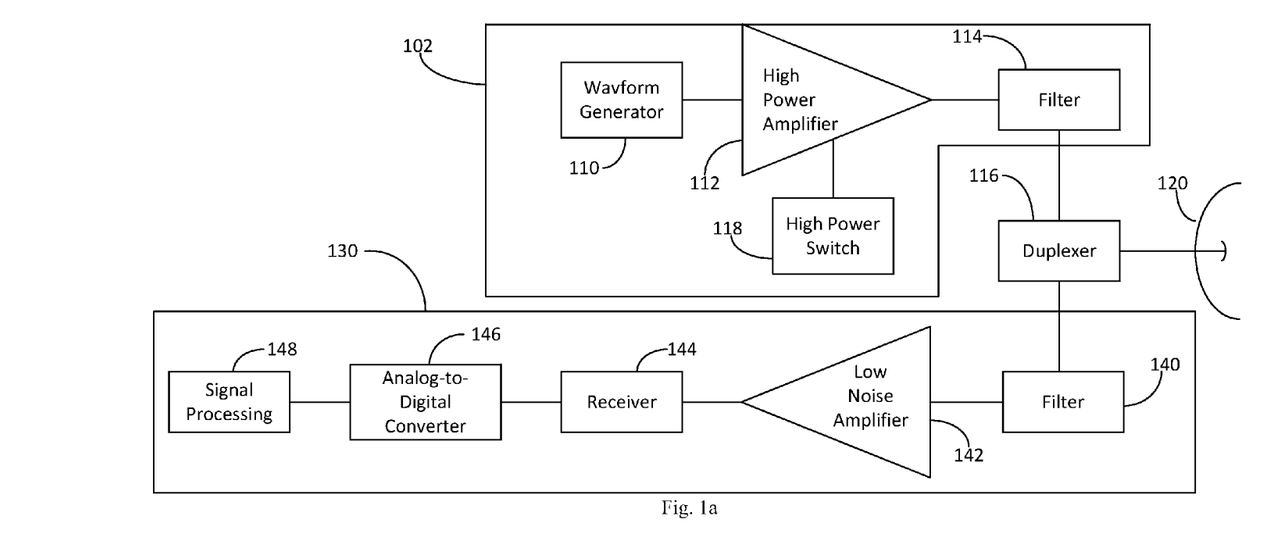
FIG. 1a illustrates a radar system according to an embodiment.

FIG. 1a illustrates a radar system 100 according to an embodiment. In FIG. 1, the transmitter side 102 of radar system 100 includes a waveform generator 110, a high power amplifier (HPA) 112, a filter 114, a duplexer 116 and an antenna 120. On the receiver side 130, the radar system 100 includes a filter 140, a low noise amplifier (LNA) 142, a receiver 144, an analog-to-digital converter 146 and signal processing 148. The transmitter side 102 produces the short duration high-power RF pulses of energy that are radiated by the antenna.

The waveform generator 110 generates the transmitting pulse in low-power. The waveform generator 110 generates the transmitting signal on an intermediate frequency (IF). The waveform generator 110 permits generating predefined waveforms by driving the amplitudes and phase shifts of carried microwave signals. Herein, the waveform generator 110 mixes the IF pulses with an exciter frequency to produce low power microwave pulses. The high power amplifier 112 amplifies the low power microwave pulses to produce the high power RF signal for transmission. A bandpass filter 114 removes any spurious signals generated by the high power amplifier 112. A high power amplifier switch 118 is provided to control the switching on and off of power to the high power amplifier 112.

The antenna connection to either the transmitter or receiver may be implemented with a circulator, a T/R switch, or a duplexor. In any case, the switching provided by duplexer 116 prevents the high-power pulses produced by the high power amplifier 112 from destroying the low noise amplifier 142 and receiver 144 if energy were allowed to enter directly the receiver side 130.

The received signal is directed by the duplexer 116 to the receiver side 130 of the radar system 100. A filter removes any out-of-band noise. The filtered signal is provided to the low noise amplifier 142, which amplifies the filtered signal for processing by the receiver 144. The receiver 144 amplifies and demodulates the received RF signals. The analog-to-digital converter 146 receives the demodulated analog signal from the receiver 144 and converts it to a digital signal. The signal processing 148 receives the digital signal and separates targets from clutter on the basis of Doppler content and amplitude characteristics.

Figure 1B:
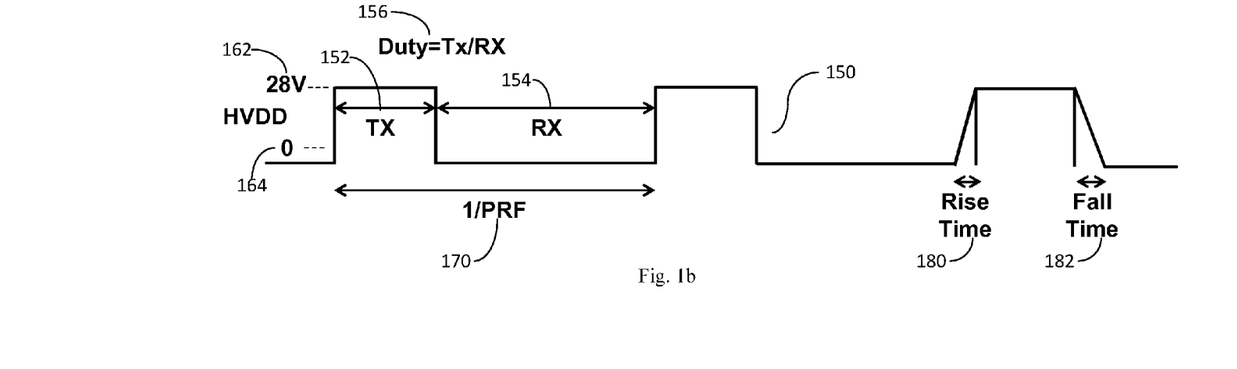
FIG. 1b shows a pulse waveform for controlling power switching to a high power amplifier.

FIG. 1b shows a pulse waveform 150 for controlling high power switch 118 supplying power to a high power amplifier 112. The pulse waveform 150 includes an on portion 152 to power the high power amplifier 112 during transmission of the radar signal at the antenna 120. During an off time 154, the high power amplifier 112 is turned off for reception of a signal on the receiver side 130. The pulse waveform 150 varies in amplitude, e.g., from 28 volts 162 to 0 volts 164. The ratio of the length of the transmit portion 152 to the receive portion 154 is the duty cycle 156 of the pulse waveform. The duty cycle 156 translates to timelines with a certain pulse repetition frequency (PRF) 170. In actual operation, the pulse 152 includes a rise time 180 and a fall time 182. The higher the PRF 170, the more rise/fall transitions for the high power amplifier 112. If the rise/fall 180, 182 transitions take a long time, part of the timeline is consumed that could have be used to either radiate out more RF power or receive more signal RF. Therefore, the rise/fall time 180, 182 of the high power amplifier 112 directly affects the sensitivity of the radar system 100.

Figure 2:
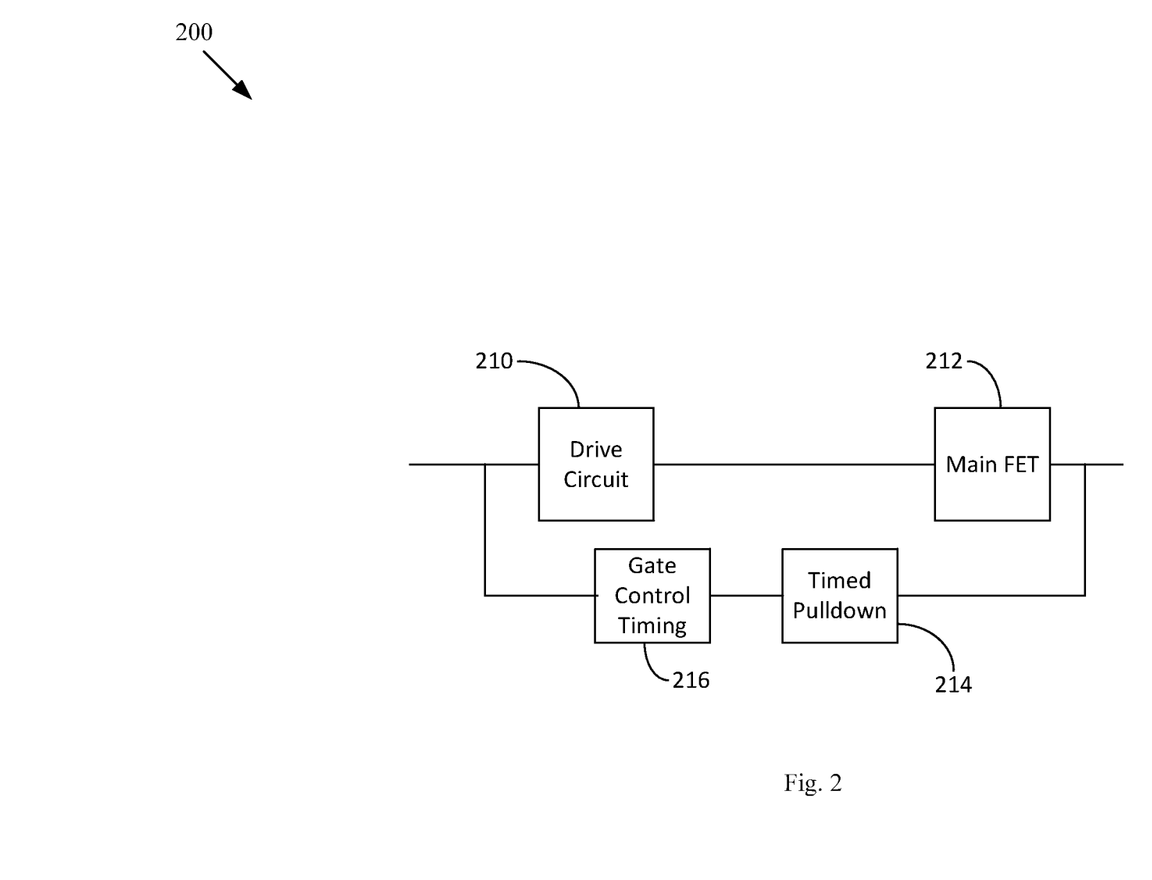
FIG. 2 illustrates a high power amplifier switch that uses a timed pulldown circuit.

FIG. 2 illustrates a high power amplifier switch 200 that uses a timed pulldown circuit. In FIG. 2, a drive circuit 210 provides a signal to a field effect transistor (FET) 212 for switching the power to a high power amplifier. A control timing circuit 216 is coupled to the input to the drive circuit 210. The control timing circuit 216 provides a signal to control a timed pulldown circuit 214 that is coupled to the drain of the FET 212. The timed pulldown circuit 214, when activated by the control timing circuit 216, drains the voltage at the drain of the FET 212. Accordingly, the control timing circuit 216 implements a variable delay from the control input signal at the drive circuit 210. The timing provided by the control timing circuit 216 is not derived from the main FET gate voltage or matched to process conditions, temperature, etc.

Figure 3:
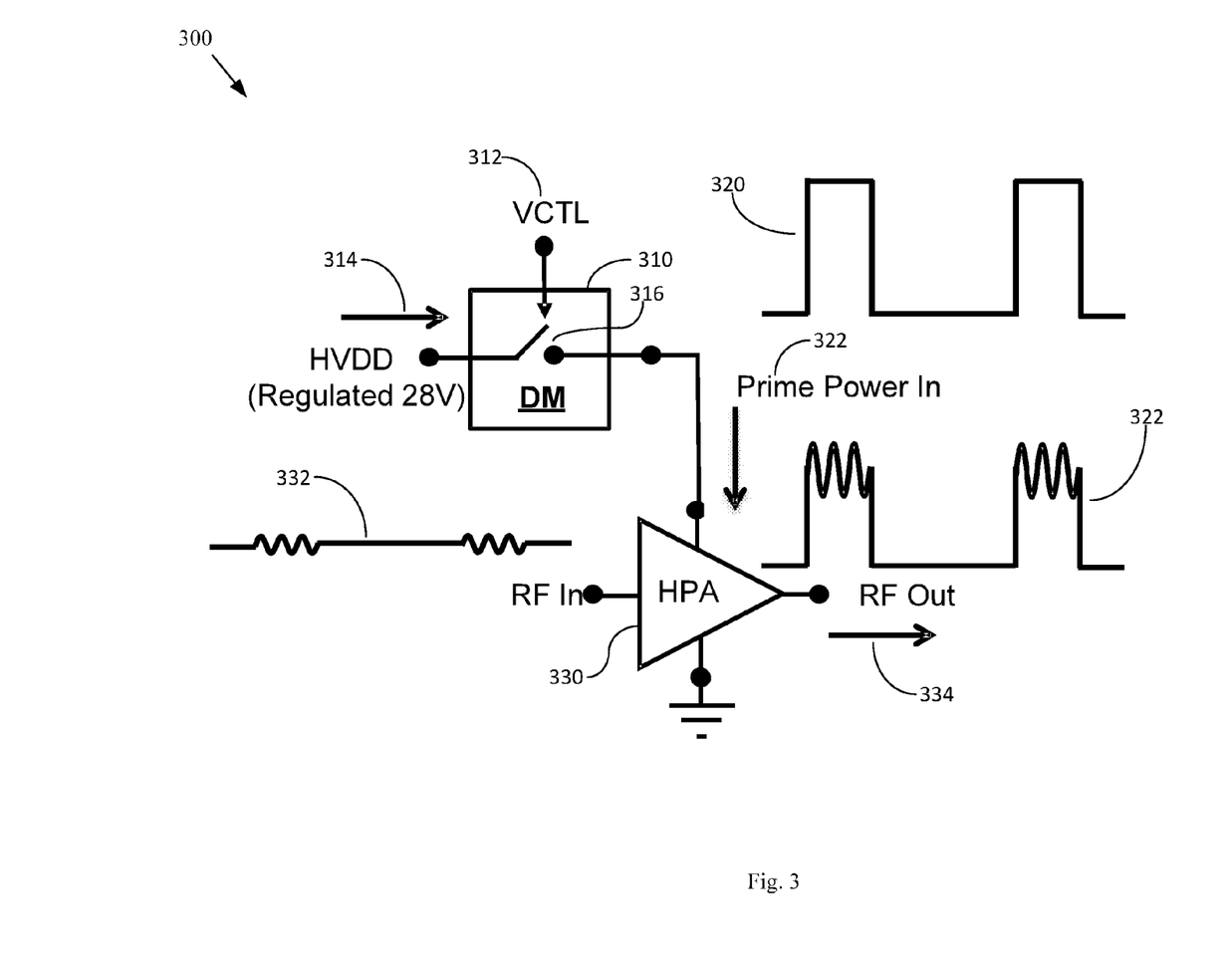
FIG. 3 illustrates a simplified view of the operation of a drain modulator according to an embodiment.

FIG. 3 illustrates a simplified view of the operation of a drain modulator 300 according to an embodiment. In FIG. 3, a drain modulator 310 is shown receiving a control signal 312. A high voltage signal 314 is received at an input of the drain modulator 310. The control signal 312 controls operation of switch 316 to apply power 322 to the high power amplifier 330. The power signal 322 exhibits a waveform 320 as shown in FIG. 3.

An RF input signal 332 is received by the high power amplifier 330. The waveform 320 of the power signal 322 turns the amplifier on and off to produce the RF output 334. The RF output 334 exhibits waveform 322 due to the pulsed waveform 320 provided by the power signal 322.

Figure 4A:
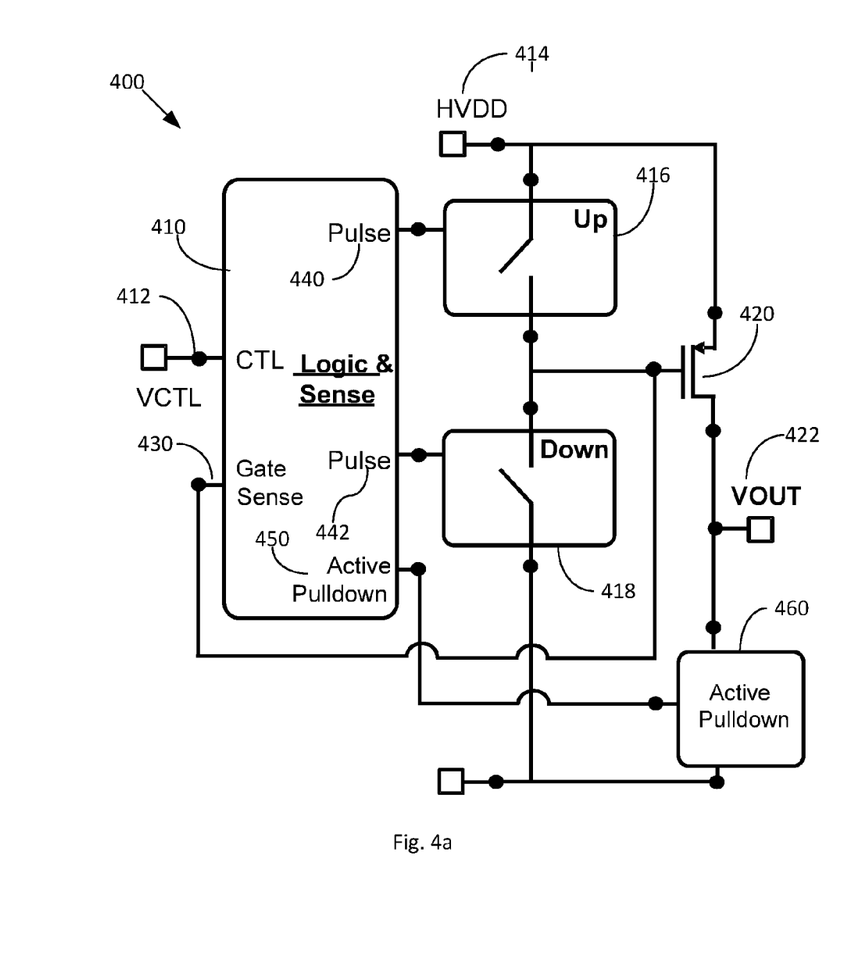
FIG. 4a illustrates a drain modulator according to an embodiment.

FIG. 4a illustrates a drain modulator 400 according to an embodiment. In FIG. 4a, a logic and sense module 410 is provided. The logic and sense module 410 receives a control signal, VCTL 412. High power voltage 414 is provided to a source of a FET output transistor 420. The drain of the FET 420 is coupled to an output terminal 422. At the gate of the FET 420, a pullup module 416 and a pulldown module 418 are provided. The logic and sense module 410 performs edge detection of the gate voltage of the FET 420, wherein an indication of the gate voltage of the FET 420 is provided to a gate sense 430 at the logic and sense module 410. The logic and sense module 410 provides a pulse 440 to the pullup module 416 to turn the FET 420 off and provides a pulse 442 to pulldown module 418 to turn the FET on. An active pull down 450 provides a control signal to active pulldown module 460 to cause the active pulldown module 460 to quickly drain current from the drain of the FET 420 thereby zeroing the voltage at the output terminal 422. The logic and sense module 410 mirrors the gate threshold of the FET 420 to track switch timing independent of process conditions, temperature, etc. The logic and sense module 410 provides a high current pulse mode for fast switch rise/fall times with a low current sustain mode to reduce power consumption when switch is in steady state.

Figure 4B:
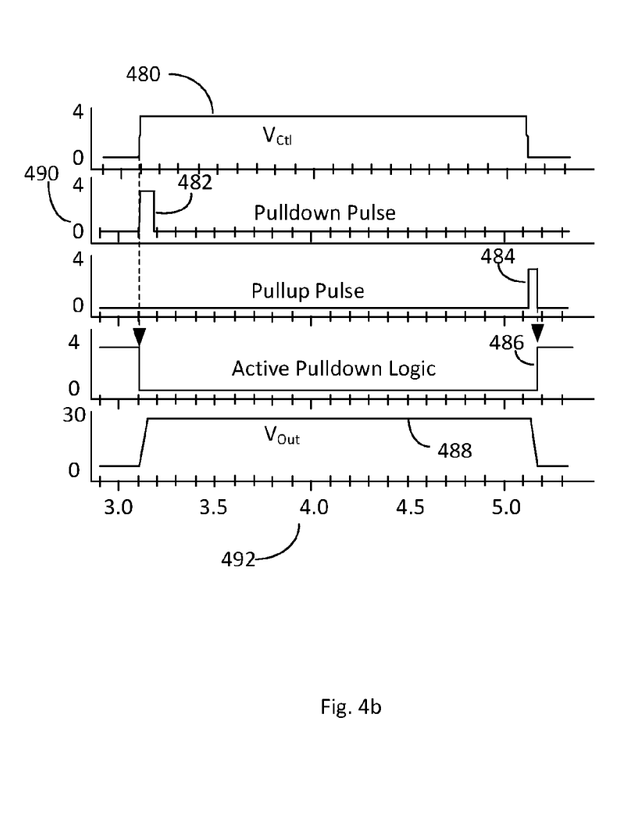
FIG. 4b illustrates the signaling involved in operation of the drain modulator according to an embodiment.

FIG. 4b illustrates the signaling involved in operation of the drain modulator 400 according to an embodiment. FIG. 4b shows five signals: The control input 480, the pulldown pulse 482, the pullup pulse 484, the active pulldown logic 486 and the output voltage 488. Each of the five signals are shown with the x-axis representing time 492 and the y-axis representing voltage 490.

Referring to FIGS. 4a and 4b, a control signal 480 is applied to the input 412 of the logic and sense module 410. The edge of the control signal 480 causes the logic and sense module 410 to generate a pulse 482 to the pulldown module 418 to turn the FET 420 on. The active pulldown logic 486 goes low and the output voltage 488 at the output terminal/drain 422 of FET 420 goes high. When the control signal 480 goes low, a pullup pulse is sent by the logic and sense module 410 to the pullup module to turn the FET 420 off. The active pulldown logic 486 goes high to activate the active pulldown module 460, which quickly drains the current from the drain of FET 420 thereby cause the output voltage 488 to quickly return to zero volts.

Figure 5A:
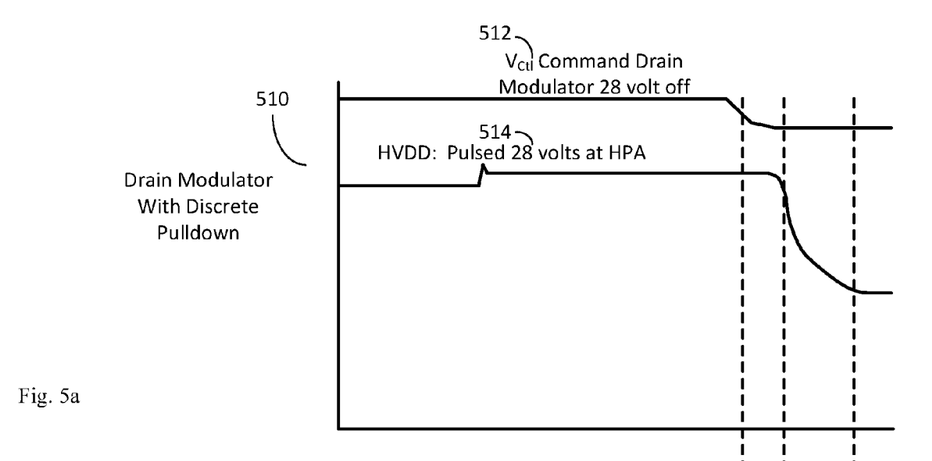
FIGS. 5a-b show a comparison to a drain modulator with discrete pulldown and a drain modulator with sensed active pulldown according to an embodiment.
Figure 5B:
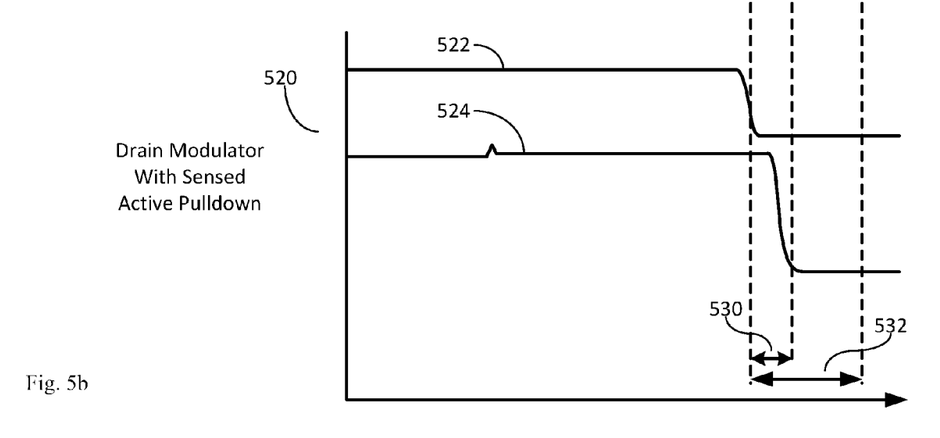

FIGS. 5a-b show a comparison to a drain modulator with discrete pulldown and a drain modulator with sensed active pulldown according to an embodiment. In FIG. 5a, the drain modulator with discrete pulldown 510 includes control signal 512 and 522 are shown. The time 532 for the power to the high power amplifier 514 to return to zero via the drain modulator using the discrete pulldown 510 is shown to be much longer than the time 530 for the power to the high power amplifier 514 to return to zero via the drain modulator with sensed active pulldown 520 according to an embodiment. In one measurement, the time 532 for the voltage to the high power amplifier 514 to return to zero via the drain modulator using the discrete pulldown was determined to be approximately two times longer than the time 530 for a drain modulator with sensed active pulldown 520.

Figure 6:
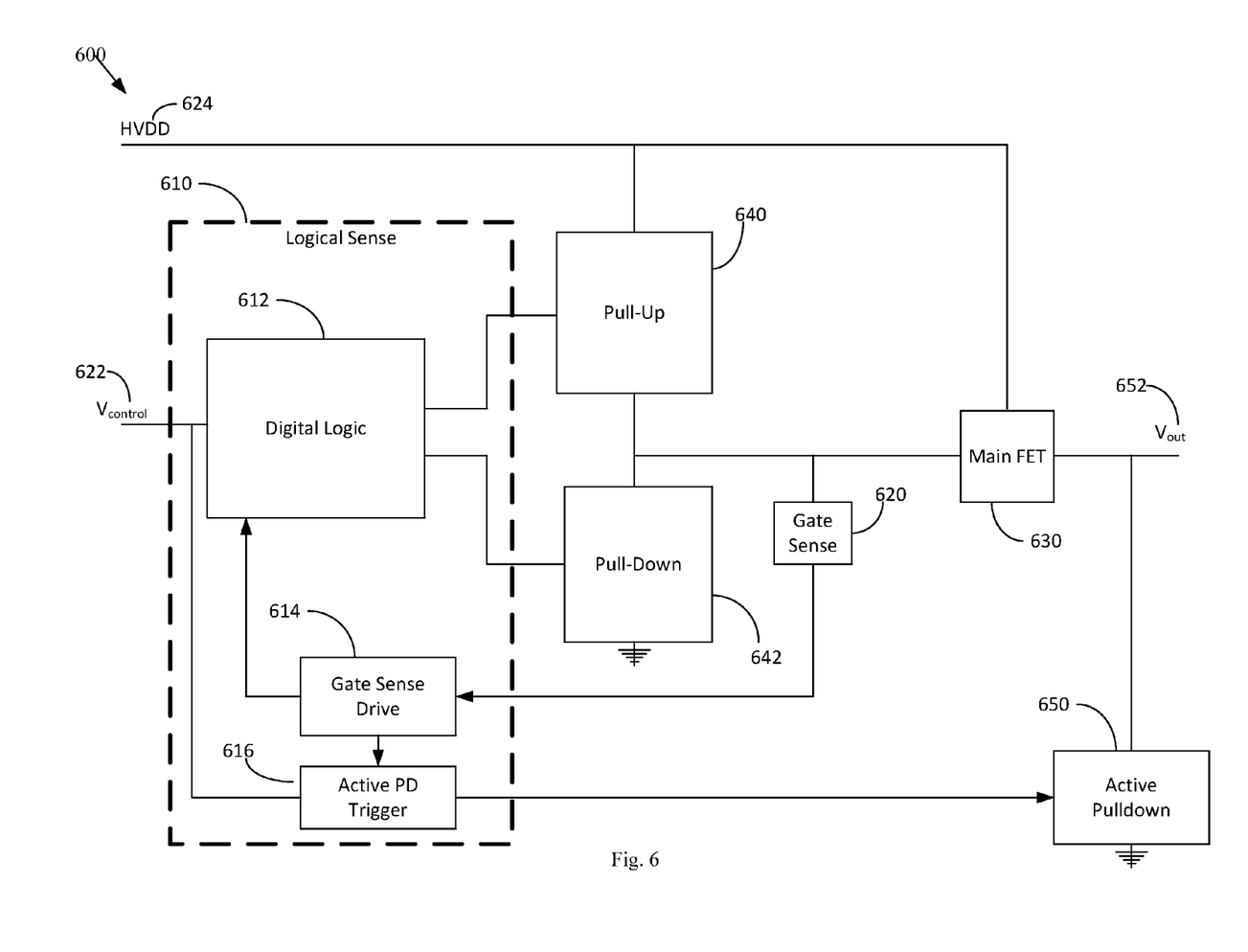
FIG. 6 is a more detailed block diagram of the drain modulator according to an embodiment.

FIG. 6 is a more detailed block diagram of the drain modulator 600 according to an embodiment. In FIG. 6, the logic and sense module 610 is shown to include digital logic 612, gate sense drive 614 and active pulldown trigger 616. The control signal 622 is received by the digital logic 612. The high voltage 624 is coupled to the pullup module 640 and the main FET 630. The digital logic 612 provides control signals to the pullup module 640 and to the pulldown module 642. Gate sense module 620 detects the edge of the voltage at the input to the FET 630 and provides an indication of the detected edge of the voltage at the input of the FET 630 to the gate sense drive module 614. The gate sense drive module 614 provides a signal to the active pulldown trigger module 616. The active pulldown trigger 616 activates the active pulldown module 650 to cause the active pulldown module 650 to quickly drain current from the FET 630 thereby zeroing the output voltage 652.

Figure 7:
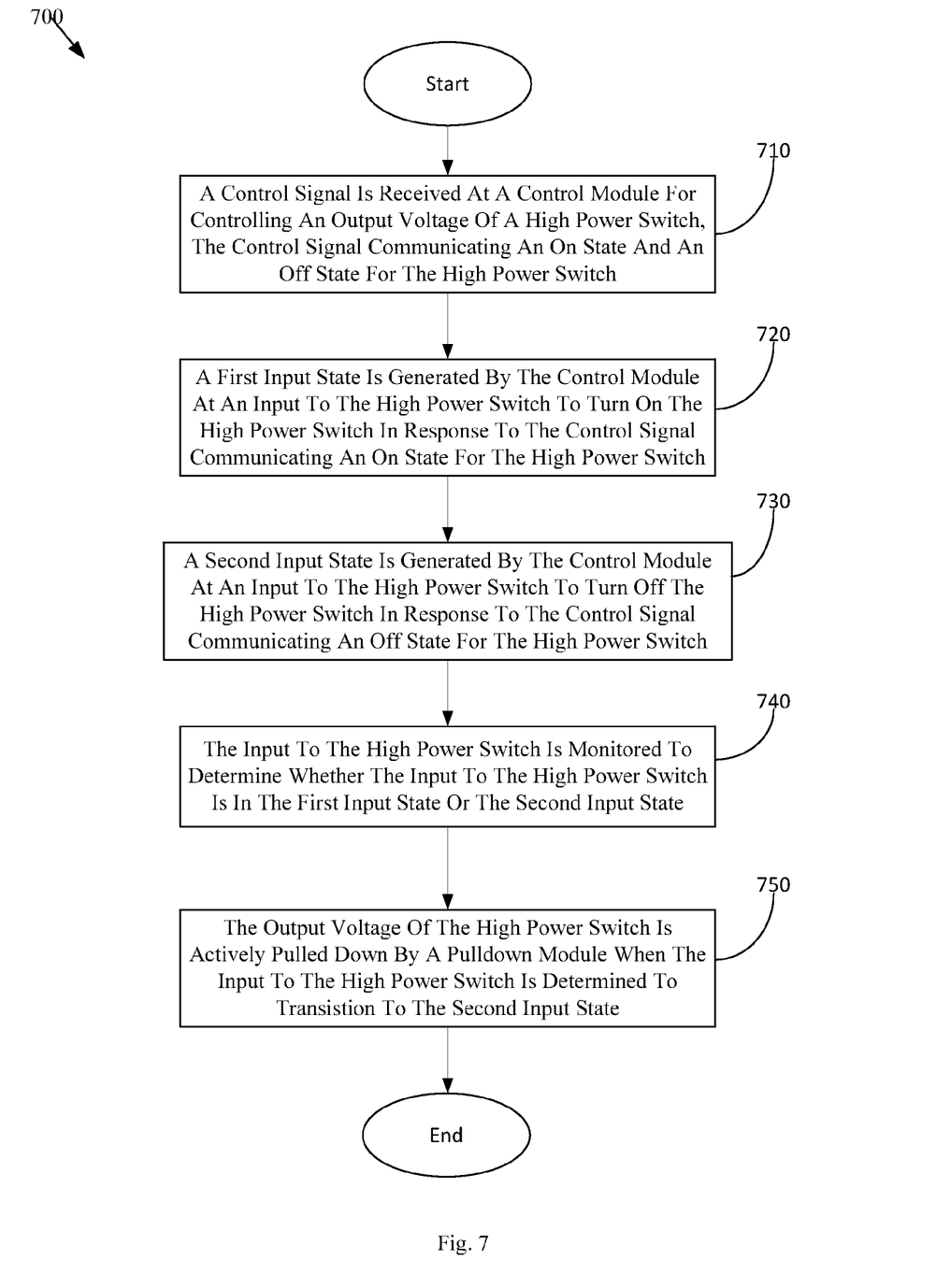
FIG. 7 is a flowchart of a method for zeroing an output of a high power amplifier switch according to an embodiment.

FIG. 7 is a flowchart 700 of a method for zeroing an output of a high power amplifier switch according to an embodiment. In FIG. 7, a control signal is received at a control module for controlling an output voltage of a high power switch, the control signal communicating an on state and an off state for the high power switch 710. A first input state is generated by the control module at an input to the high power switch to turn on the high power switch in response to the control signal communicating an on state for the high power switch 720. A second input state is generated by the control module at an input to the high power switch to turn off the high power switch in response to the control signal communicating an off state for the high power switch 730. The input to the high power switch is monitored to determine whether the input to the high power switch is in the first input state or the second input state 740. The output voltage of the high power switch is actively pulled down by a pulldown module when the input to the high power switch is determined to transition to the second input state 750.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure, for example, to comply with 37 C.F.R. §1.72(b) in the United States of America. It is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A drain modulator, comprising:
a logic and sense module arranged to receive a control signal for controlling an on and an off state of an input of a switch to turn a high power voltage at an output of the switch on and off;
a pullup module coupled to the input of the switch;
a pulldown module coupled to the input of the switch; and
an active pulldown module coupled to the output of the switch;
wherein the logic and sense module monitors the input to the switch and activates the active pulldown module to drain the output of the switch to a zero voltage when the input of the switch transitions to the off state.

2. The drain modulator of claim 1, wherein the switch is a high power field effect transistor (FET).

3. The drain modulator of claim 2, wherein the logic and sense module mirrors a threshold of a gate of the FET to track switch timing independent of process conditions and temperature.

4. The drain modulator of claim 2, wherein the logic and sense module includes a gate sense module to detect an edge of the voltage at the input to the FET and provides an indication of the detected edge of the voltage at the input of the FET to a gate sense drive module.

5. The drain modulator of claim 4, wherein the logic and sense module includes an active pulldown trigger arranged to activate the active pulldown module to cause the active pulldown module to drain current from the FET thereby causing the voltage at a drain of the FET to go to zero volts.

6. The drain modulator of claim 1, wherein the pullup module is pulsed by the logic and sense module to create an off state at the input of the switch.

7. The drain modulator of claim 1, wherein the pulldown is pulsed by the logic and sense module to create an on state at the input of the switch.

8. The drain modulator of claim 1, wherein the logic and sense module includes digital logic for processing the control signal to generate a pulse to the pullup module and the pulldown module.

9. The drain modulator of claim 1, wherein the logic and sense module provides a high current pulse mode for fast switch rise and fall times with a low current sustain mode to reduce power consumption when the switch is in steady state.

10. A method for providing gate sensed active pulldown to a high power switch, comprising:
receiving, at a control module, a control signal for controlling an output voltage of a high power switch, the control signal communicating an on state and an off state for the high power switch;
generating, by the control module, a first input state at an input to the high power switch to turn on the high power switch in response to the control signal communicating an on state for the high power switch;

generating, by the control module, a second input state at an input to the high power switch to turn off the high power switch in response to the control signal communicating an off state for the high power switch;

monitoring the input to the high power switch to determine whether the input to the high power switch is in the first input state or the second input state; and pulling down the output voltage of the high power switch to zero volts by an active pulldown module when the input to the high power switch is determined to transition to the second input state.

11. The method of claim 10, wherein the receiving a control signal for controlling an output voltage of a high power switch further comprises receiving a control signal for controlling an output voltage of a field effect transistor (FET).

12. The method of claim 11, wherein the monitoring the input to the high power switch further comprises mirroring a threshold of a gate of the FET to track switch timing independent of process conditions and temperature.

13. The method of claim 11, wherein the monitoring the input to the high power switch further comprises detecting detect an edge of the voltage at the input to the FET and providing an indication of the detected edge of the voltage at the input of the FET to a gate sense drive module.

14. The method of claim 11, wherein the pulling down the output voltage of the high power switch to zero volts further comprises activating the active pulldown module to cause the active pulldown module to drain current from the FET thereby causing the voltage at a drain of the FET to decrease to zero volts.

15. The method of claim 10, wherein the pulling down the output voltage of the high power switch to zero volts further comprises pulsing a pullup module to create an off state at the input of the switch.

16. The method of claim 10, wherein the pulling down the output voltage of the high power switch to zero volts further comprises pulsing the pulldown module to create an on state at the input of the switch.

17. The method of claim 10, wherein the pulling down the output voltage of the high power switch to zero volts further comprises providing a high current pulse mode for fast switch rise and fall times with a low current sustain mode to reduce power consumption when the switch is in steady state.

18. A radar system, comprising:
a waveform generator for generating radar waveforms;
a high power amplifier, arranged to receive the generated waveforms and to amplify the generated waveforms to produce a high power radar transmission signal;
a drain modulator, coupled to the high power amplifier, the drain modulator arranged to switch the high power amplifier on and off, wherein the drain modulator includes:
a logic and sense module arranged to receive a control signal for controlling an on and an off state of an input of a switch to turn a high power voltage at an output of the switch on and off for turning the high power amplifier on and off;
a pullup module coupled to the input of the switch;
a pulldown module coupled to the input of the switch; and
an active pulldown module coupled to the output of the switch;
wherein the logic and sense module monitors the input to the switch and activates the active pulldown module to drain the output of the switch to a zero voltage when the input of the switch transitions to the off state.

19. The radar system of claim 18, wherein the switch is a high power field effect transistor (FET).

20. The radar system of claim 19, wherein the logic and sense module mirrors a threshold of a gate of the FET to track switch timing independent of process conditions and temperature.

21. The radar system of claim 19, wherein the logic and sense module includes a gate sense module to detect an edge of the voltage at the input to the FET and provides an indication of the detected edge of the voltage at the input of the FET to a gate sense drive module.

22. The radar system of claim 21, wherein the logic and sense module includes an active pulldown trigger arranged to activate the active pulldown module to cause the active pulldown module to drain current from the FET thereby causing the voltage at a drain of the FET to go to zero volts.

23. The radar system of claim 18, wherein the pullup module is pulsed by the logic and sense module to create an off state at the input of the switch.

24. The radar system of claim 18, wherein the pulldown is pulsed by the logic and sense module to create an on state at the input of the switch.

25. The radar system of claim 18, wherein the logic and sense module includes digital logic for processing the control signal to generate a pulse to the pullup module and the pulldown module.

* * * * *